(12) United States Patent
Schoeppach et al.

(10) Patent No.: US 7,920,344 B2
(45) Date of Patent: Apr. 5, 2011

(54) ARRANGEMENT FOR MOUNTING AN OPTICAL ELEMENT

(75) Inventors: Armin Schoeppach, Aalen (DE); Christian Zenger/Ling, Muehlhausen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 12/506,450

(22) Filed: Jul. 21, 2009

(65) Prior Publication Data

US 2009/0284849 A1    Nov. 19, 2009

Related U.S. Application Data

(63) Continuation of application No. 11/959,914, filed on Dec. 19, 2007, now abandoned, which is a continuation of application No. PCT/EP2006/006353, filed on Jun. 30, 2006.

(60) Provisional application No. 60/696,432, filed on Jul. 1, 2005.

(51) Int. Cl.
    *G02B 7/02* (2006.01)
(52) U.S. Cl. .................................. 359/819; 359/822
(58) Field of Classification Search .......... 359/811–824, 359/694–701
See application file for complete search history.

(56) References Cited

U.S. PATENT DOCUMENTS

| | | | | |
|---|---|---|---|---|
| 2,937,571 | A | 5/1960 | Thompson | 359/813 |
| 4,268,123 | A | 5/1981 | Mesco | 248/488 |
| 4,929,054 | A * | 5/1990 | Ahmad et al. | 359/820 |
| 5,428,482 | A | 6/1995 | Bruning et al. | 359/827 |
| 6,229,657 | B1 | 5/2001 | Holderer et al. | 359/822 |
| 6,239,924 | B1 * | 5/2001 | Watson et al. | 359/819 |
| 6,366,413 | B1 | 4/2002 | Trunz et al. | 359/811 |
| 6,400,516 | B1 | 6/2002 | Spinali | 359/819 |
| 2002/0021503 | A1 | 2/2002 | Osterried | 359/811 |
| 2002/0163741 | A1 | 11/2002 | Shibazaki | 359/811 |
| 2003/0162484 | A1 | 8/2003 | Oshino | 359/811 |
| 2003/0234989 | A1 | 12/2003 | Oshino et al. | 359/811 |

FOREIGN PATENT DOCUMENTS

| | | |
|---|---|---|
| DE | 198 25 716 A1 | 12/1999 |
| DE | 199 57 398 A1 | 5/2001 |
| EP | 1 081 521 | 3/2001 |
| EP | 1 245 982 A2 | 10/2002 |
| EP | 1 326 114 | 7/2003 |
| WO | WO 04/001478 | 12/2003 |

OTHER PUBLICATIONS

D. Vukobratovich, "Flexure mounts for high-resolution optical elements," Proc. Of SPIE vol. 0959, Optomechanical and Electro-Optical Design of Industrial Systems, ed. R. J. Bieringer, K.G. Harding (Jan. 1988).

* cited by examiner

*Primary Examiner* — Mohammed Hasan
(74) *Attorney, Agent, or Firm* — Fish & Richardson P.C.

(57) ABSTRACT

Arrangements for mounting an optical element, such as a lens or a mirror, are disclosed.

22 Claims, 5 Drawing Sheets

ARRANGEMENT FOR MOUNTING AN OPTICAL ELEMENT

CROSS-REFERENCE TO RELATED APPLICATIONS

This application is a continuation of, and claims priority under 35 U.S.C. §120 to, U.S. patent application Ser. No. 11/959,914, filed Dec. 19, 2007 now abandoned, which is a continuation of, and claims priority under 35 U.S.C. §120 to, international application serial number PCT/EP2006/006353, filed Jun. 30, 2006, which claims the benefit of U.S. patent application Ser. No. 60/696,432, filed Jul. 1, 2005. The above-noted applications are incorporated by reference herein.

FIELD

The disclosure relates to arrangements for mounting an optical element, such as a lens or a mirror.

BACKGROUND

Criteria for mounting optical components in supports have been published, for example, in the article "Flexure mounts for high-resolution optical elements" by D. Vukobratovich, Proc. Of SPIE Vol 0959, Optomechanical and Electro-Optical Design of Industrial Systems, ed. R. J. Bieringer, K. G. Harding (January 1988).

SUMMARY

In one aspect, the disclosure provides an arrangement that includes an optical element, a constraining device and elastically resilient elements. The optical element has an outer peripheral area and at least three constraint locations arranged at the outer peripheral area of the optical element. The constraining device has a carrier body, and the elastically resilient elements are arranged in the constraining device. The optical element is constrained via the constraint locations in at least one direction through force-based contact with the elastically resilient elements, and the constraining device constrains the optical element in a statically determinate manner in the carrier body.

In another aspect, the disclosure provides a device that includes two arrangements of the type described in the preceding paragraph, where the optical elements of the arrangements are arranged on a single carrier.

In a further aspect, the disclosure provides an assembly that includes a constraining device having a carrier body. The assembly also includes elastically resilient elements arranged in the constraining device. The assembly is configured so that an optical element having constraining locations at its outer periphery can be constrained via the constraint locations in at least one direction through force-based contact with the elastically resilient elements. The constraining device can constrain the optical element in a statically determinate manner in the carrier body.

In some embodiments, the disclosure can provide an improved approach for supporting an optical component, such as a lens.

In certain embodiments, an optical element is constrained in at least one direction by way of constraint areas that are in force-based contact with elastically resilient elements, where the elastically resilient element for each constraint area is located in a constraining device with a carrier body and the constraining devices hold the optical element on the carrier body in a statically determinate manner.

Certain optical elements such as mirrors or lenses which, due to their shape, are sensitive to deformation, a technical concept is proposed for the connection between the optical element which consists of glass or a similar material, and the mount which holds the optical element in at least three places. In view of the kinematic support concept, it can be desirable to use at these three locations two coupling locations, each exerting two holding forces. In this case, either an axial force is used in combination with a tangential force, or an axial force in combination with a force of arbitrary direction in a plane that extends orthogonal to the optical axis, wherein as a principle the lines of action of these forces should not intersect each other in one point. The terms "axial", "radial" and "tangential" refer to the optical axis of the element and the projection of the outside contour of the optical element into a plane that extends orthogonal to the optical axis.

In some embodiments, time-dependent effects such as settling effects in coupling locations and relaxation of internal stresses between components can largely be avoided. Therefore, the number of contact locations is also limited to a minimum. To hold the elements, a connection can be realized exclusively with force-based contact, and no frictional connections are used. Due to the use of elastic forces of minimal magnitude, the occurrence of distortion-causing stresses can be reduced to a minimum.

According to the concept of the disclosure, connections with force-based contact are used instead of connections with frictional contact. Some advantages of this kind of a connection are described in the following.

With a movement, more specifically an acceleration A, of the optical element of the mass M for example in an x-direction which may represent a tangential direction, for example as a result of a shock load, a change in force $F_T = M \times A$ will act on the optical element in the tangential direction (or generally in the direction of the acceleration), which in a friction-based holder arrangement (for example via a leaf spring or a diaphragm spring) of the optical element would involve holding forces of a magnitude of at least $F_{RS} = M \times A / \mu$. In a holder arrangement with force-based contact via a soft spring, optionally having a flat spring characteristic, a change in force of an amount of only $\Delta F_{KS} = M \times A$ is applied to the optical element in order to hold it in position. The force $F_{RS}$ in this example is acting perpendicular to the seating surface of the optical element so that in case of an axial acceleration of the optical element, this force will act in the axial direction ($F_{axial}$). The symbol $\mu$ stands for the coefficient of static friction which, with the desired precise finish of the seating surfaces, is in the range from about 0.1 to 0.2. Due to the small coefficient of static friction, a significantly larger axial force $F_{axial}$ is needed for example in case of an acceleration in the x-direction in order to hold the optical element than would be the case with a holder arrangement of the optical element with force-based contact, where the inertial forces of acceleration are absorbed directly for example via elastic elements. As the foregoing example shows, the amount of $\Delta F_{KS}$ to hold the element through force-based contact is very much smaller than the amount for $F_{RS}$ desired for holding the element through friction-based contact, so that in the former case the optical element is exposed to a lower overall level of mechanical stress. In the case of a connection by force-based contact through an elastic device, the spring force, i.e. the force generated by the deformation of the elastic device acting against the direction of the acceleration, will push the optical element back to its original position, while in the case of a friction-based connection the optical element can behave in a non-defined way, if for example its fixation through static friction is compromised for short time intervals. It further needs to be pointed out that with a friction-based holding arrangement of the optical element, the large force effecting the friction hold needs to act on the optical element continuously, while with a holding arrangement of the optical element that is based on force-based contact, the optical element is exposed to a force that depends on the elastic properties of the elastic elements providing the force-based connection and is significantly reduced in comparison to the friction based connection, and this reduced force is present only at the occurrence of the aforementioned acceleration A of the optical element or in case of an abrupt force acting on the optical element (see description of FIG. 1 below). The holder arrangement of the optical element based on force-based contact therefore performs the holding function with significantly reduced amounts of stress in comparison to the friction-based hold on the optical element.

FIG. 1 shows the force $F_T$ which acts on an optical element (for example in the tangential direction) in a case where an optical element is held by force-based contact in a position x (which is defined for example by one of the two points indicated on the x-axis, with x being a general spatial coordinate) if the optical element is held via an elastic element which is not pre-biased with regard to the holding force. In case a force $\Delta F_{KS}$ occurs as a result of a force pulse or an acceleration of the optical element, it will cause a displacement $\Delta x$ Of the optical element which is determined by the elastic element that holds the optical element. After the effect of the force $\Delta F_{KS}$ has subsided, the optical element returns to its original position. The same behavior takes place in the case of an elastic element that is pre-tensioned via a given force, if the force $\Delta F_{KS}$ exceeds the preset pre-tensioning force. If in the case of a pre-tensioned elastic element the force $\Delta F_{KS}$ is smaller than the given pre-tensioning force, the optical element will remain in its original position, i.e. the amount of displacement is zero ($\Delta x=0$). The symbol $F_{KS}$ stands for the force to be produced by the elastic element and acting on the optical element in order to hold the latter at the position x. Thus, $F_{KS}$ represents the minimum force exerted by the elastic (resilient) element in the direction of the force-based hold on the optical element in order to hold the latter at the position x.

With a connection based purely on frictional contact, to ensure that the optical element remains in its original position, the force acting on the optical element as a result of a force pulse should not exceed the static friction force. Thus, if under a force pulse the same force $\Delta F_{KS}$ takes effect as in the force-based contact connection discussed above, the optical element will not change its position, i.e. stay securely in place, if the multiplication product of the static friction coefficient μ and a force $F_{RS}$ which is acting perpendicular to the surfaces providing the static friction between the optical element and the holder element is larger than the force $\Delta F_{KS}$ caused by the force pulse, i.e. if $F_{RS} \times \mu > \Delta F_{KS}$. This is based on the assumption that the force caused by the force pulse has the direction of the surfaces which provide the static friction. If this is not the case, then $\Delta F_{KS}$ needs to be replaced by the force component in the direction, which can be obtained by representing $\Delta F_{KS}$ through a set of vector components. If the condition $F_{RS} \times \mu > \Delta F_{KS}$ is not met, there is a risk that the optical element becomes displaced from its original position and takes on a new position in which it remains even after the force has subsided, i.e. after the shock has ended.

As described above, because of the small value of the coefficient μ of static friction, the force $F_{RS}$ in a friction-based holding arrangement of the optical element needs to be about 5 to 10 times as large as the maximum amount of the forces that have to be anticipated as a result of force pulses acting on the optical element or as a result of accelerations of the optical element. This is indicated schematically in FIG. 1 by the amount of $F_{RS}$ which shows that the optical element is exposed to larger amounts of stress than in the case of a holder arrangement based on force-based contact. However, if these larger stresses which are present in a friction-based holder arrangement of the optical element, are accepted for a holder arrangement based on force-based contact, the force $\Delta F_{RS}$ which can be absorbed by the holder system in case of a possible force pulse will be significantly larger under an identical given amount of tolerated displacement $\Delta x$ (see FIG. 1) of the optical element. The situation shown in FIG. 1 is based on the simplifying assumption that the force $F_{RS}$ for the optical element at the position x is produced by an elastic element of the holder device which is not pre-tensioned.

In some embodiments, protrusions are formed on the optical element. Advantageously, the protrusions are formed out of the optical element itself. As an alternative, they can also be formed by elements such as ledges, consoles or small blocks that are attached to the optical element for example by wringing or by adhesive bonding.

It further turns out to be advantageous if two coupling locations are provided at each of the protrusions which are acted on by two holding forces serving to hold the optical element in the carrier body.

Advantageously, in an arrangement of this kind an axial force as well as a tangential force act on the optical element at each of the coupling locations.

As an alternative to this concept, it can also be advantageously envisioned that at each of the coupling locations an axial force and a further force oriented in an arbitrary direction perpendicular to the axis of the optical element are acting on the optical element, wherein the arbitrarily directed forces have lines of action that are not intersecting each other in a single point.

An arrangement is advantageous in which the protrusions are held exclusively by force-based contact.

According to the disclosure, by using elastic forces of a minimal magnitude to hold the optical element, the distortion-causing stress of the optical element can be reduced to a minimum.

An arrangement is of advantage in which the elastic elements are arranged in holder devices which partially surround the elastic elements.

Advantageously, the elastic elements are constituted by pre-tensioned compression springs.

It is envisioned in a further advantageous embodiment that the compression springs are holding the protrusions in the axial and tangential directions. This arrangement can be realized advantageously with one or two compression springs arranged in the tangential direction and one or two compression springs arranged in the axial direction.

It is advantageous if the compression springs are pre-tensioned only far enough to enable them to absorb shock loads occurring during transportation of the optical element.

In a further advantageous embodiment of the inventive arrangement, it is envisioned that the compression springs are arranged in a clamping unit which receives the carrier body and holds the latter by way of a monolithically formed hinge.

In addition the monolithic hinge can be realized advantageously as a bipod via two rods.

It can be advantageous if the protrusions of the optical element or the optical element itself, such as its border area, contains notches or grooves in the axial direction, optionally in the radial and/or tangential directions for the connection with elastically resilient elements of the constraining device.

It can be advantageous if the compression springs are received by the notches or grooves. There can also be spacer elements inserted between the compression springs and the, e.g., V-shaped grooves or depressions.

In a further embodiment of the disclosure, the protrusions of the optical element are held by way of the elastic elements, specifically by way of the compression springs, in a clamp that belongs to the constraining device.

The use of compression springs exerting a reduced force (in contrast to arrangements in which the optical element is clamped through friction based contact) reduces displacements and deformations of the coupling locations caused by clamping forces and also reduces relaxation- and settling effects if an appropriately small spring constant is chosen for the springs (see FIG. 1).

The kinematic uncoupling by way of monolithic hinges reduces the number of contact locations and leads to a support arrangement that can be optimized statically and dynamically through known methods. By way of the attachment of three bipods at the outer support ring or also by the integration in the bipods themselves, an active adjustment can be achieved by way of piezoelectric of an electromagnetic drive device.

The disclosure also relates to a device that comprises two arrangements, each of which includes an optical element, wherein each of the optical elements is of a design as described above. The optical elements are arranged in this device with clamping elements or constraining devices that are arranged in alternatingly standing and hanging positions on a single support ring.

BRIEF DESCRIPTION OF THE FIGURES

The disclosure is explained in more detail below with references to the drawing, wherein.

DETAILED DESCRIPTION

Figure 1:
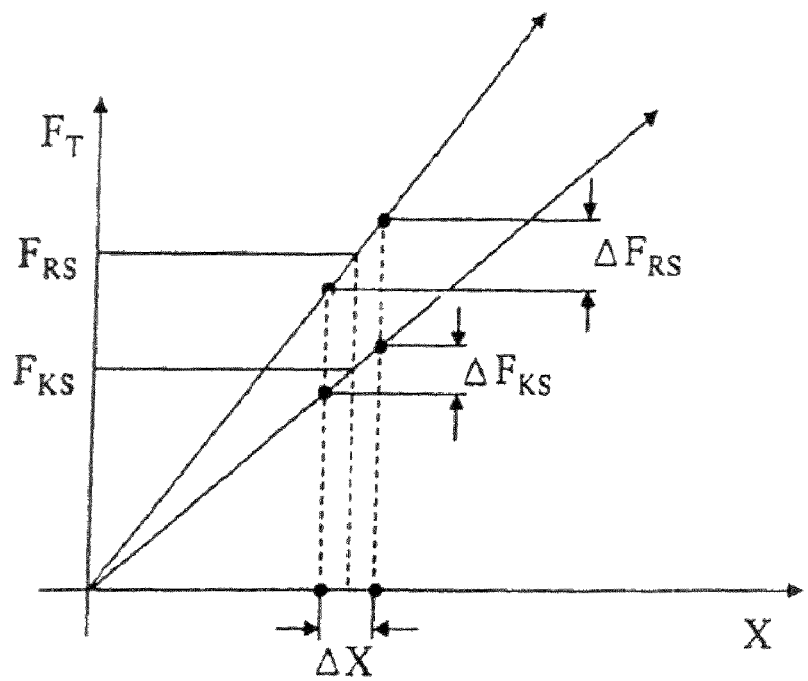
FIG. 1 represents forces that are present with a force-based connection.

A clamping element 1 (see FIG. 2), also referred to as a bipod and hereinafter also called a constraining device, includes a base or carrier body 2 with a central cutout 3 and two lateral feet 4, 5 which are supported on a support (reference 6 in FIG. 3) which is configured for example as a ring 6. The feet 4, 5 are configured according to a design principle disclosed for example in EP 1 245 982 A2, which is hereby referenced in regard to the design of the feet. They include leaf-spring-like bending members 7 and/or monolithic hinges of the kind used in constraining devices disclosed in EP 1 245 982.

Installed in the cutout 3 and connected to the carrier body 2 by way of holder plates 8, 9, 10 (FIG. 2) and screws 11, 12 is a support 13 which is acted on by three compression springs 14, 15, 16 to hold a protrusion 17 of an optical element, for example a lens 18. The optical element is secured in the tangential direction by way of the two compression springs 14, and in the axial direction by way of the compression spring 16.

Besides the clamping element (constraining device) 1, the lens 18 is held by two further constraining devices (clamping elements) 19, 20, wherein in each of the constraining devices the pre-tensioned compression springs 14, 15, 16 hold the lens 18 by the protrusion which is placed in between the springs.

Figure 3:
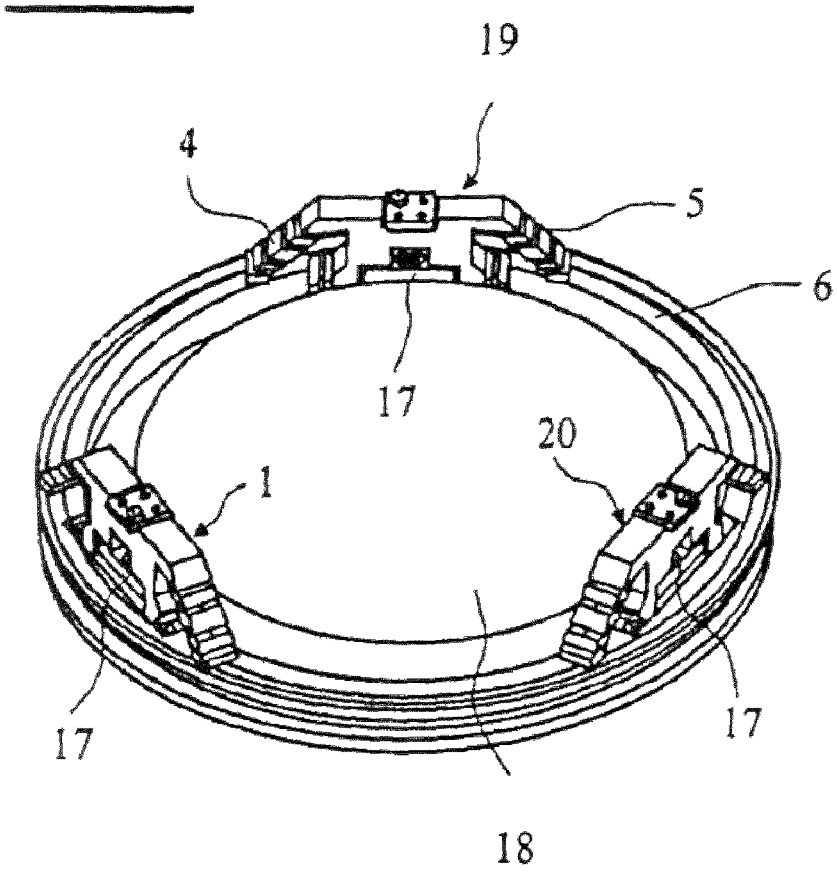
FIG. 3 represents a perspective view of an arrangement with an optical element supported in a carrier body by way of three constraining devices with clamping elements.
Figure 4:
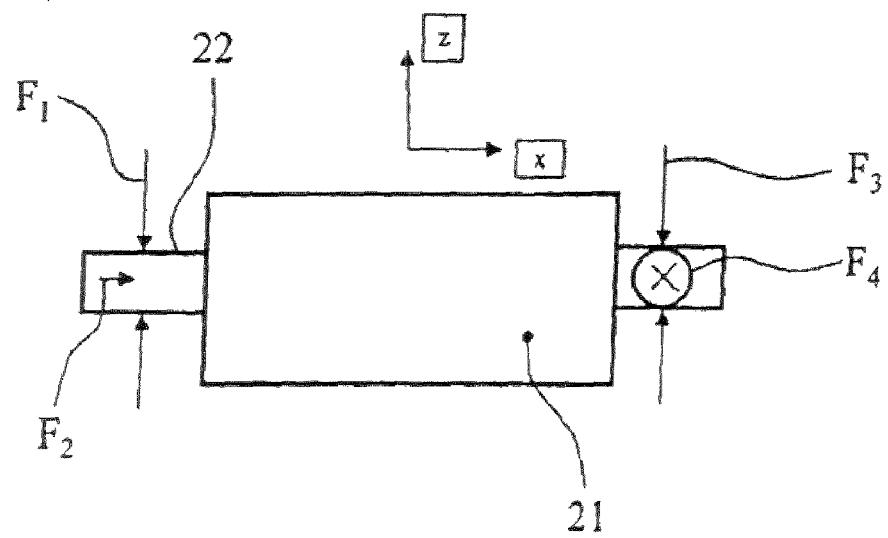
FIGS. 4-8 show in a schematic manner how the optical element can be held in the arrangement.

FIG. 4 illustrates in a schematic way how a random combination of forces act on an optical element 21 with a protrusion 22. Forces $F_1$ and $F_2$ acting on the protrusion 22 are oriented, respectively, in the axial direction and in a random direction in a plane defined by a cross-section of the optical element, which is normally orthogonal to the optical axis z. Forces $F_3$ and $F_4$ are acting in the axial and the tangential direction, respectively, in relation to the circular perimeter of the optical element 21. The axial forces $F_1$ and $F_3$ are taken up in this case by the constraining devices according to FIGS. 1 and 3 by way of the compression springs 16 which can have the general form of fixation elements that are elastic in the axial direction. The tangential forces $F_4$ are received in the constraining devices according to FIG. 1 which are arranged as shown in FIG. 3 by way of the compression springs 14 and 15. These springs can analogously be substituted by elements in the general form of fixation elements that are elastic in the tangential direction.

Figure 5:
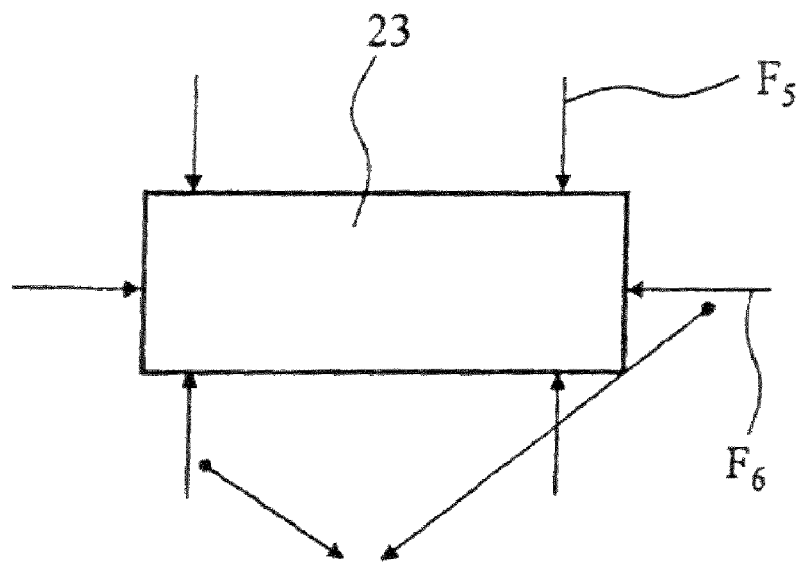

On a protrusion 23 (see FIG. 5) of an optical element a coupling location is created for forces $F_5$ acting in the axial direction and for forces $F_6$ acting in the tangential direction. Each of the coupling locations can be a planar surface extending perpendicular to the respective force, so as not to split off components of the forces into directions other than axial or tangential, as would be the case if the surfaces were not oriented at right angles to the forces. This arrangement has the advantage that the axial and tangential forces can be taken up directly by the fixating elements such as for example the compression springs 14, 15, 16 shown in FIG. 2 which are arranged in the holder device 1 in the axial and tangential directions and are designed so that each fixating element is elastically resilient in one of these directions.

Figure 2:
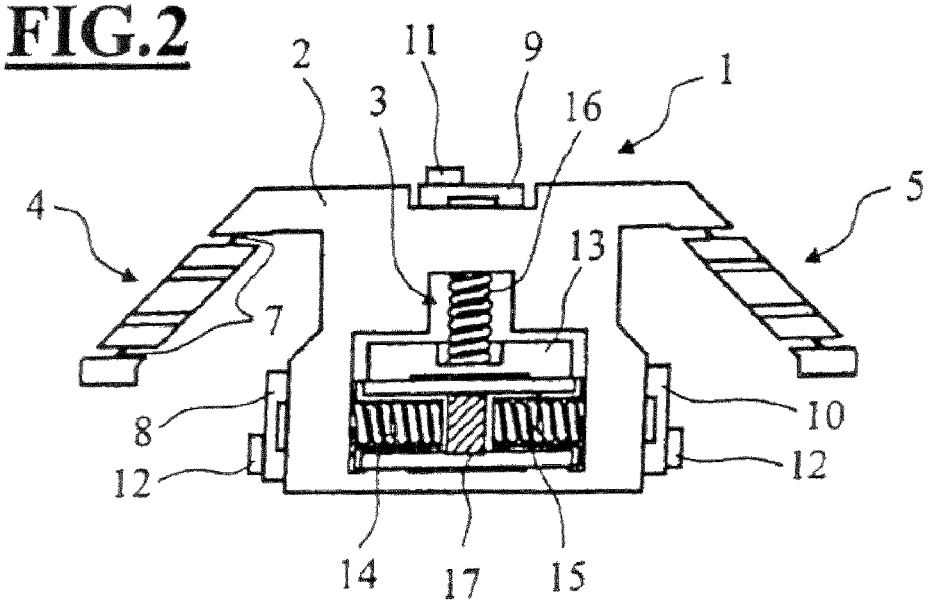
FIG. 2 shows a view from above of a clamping element with constraining device.
Figure 6:
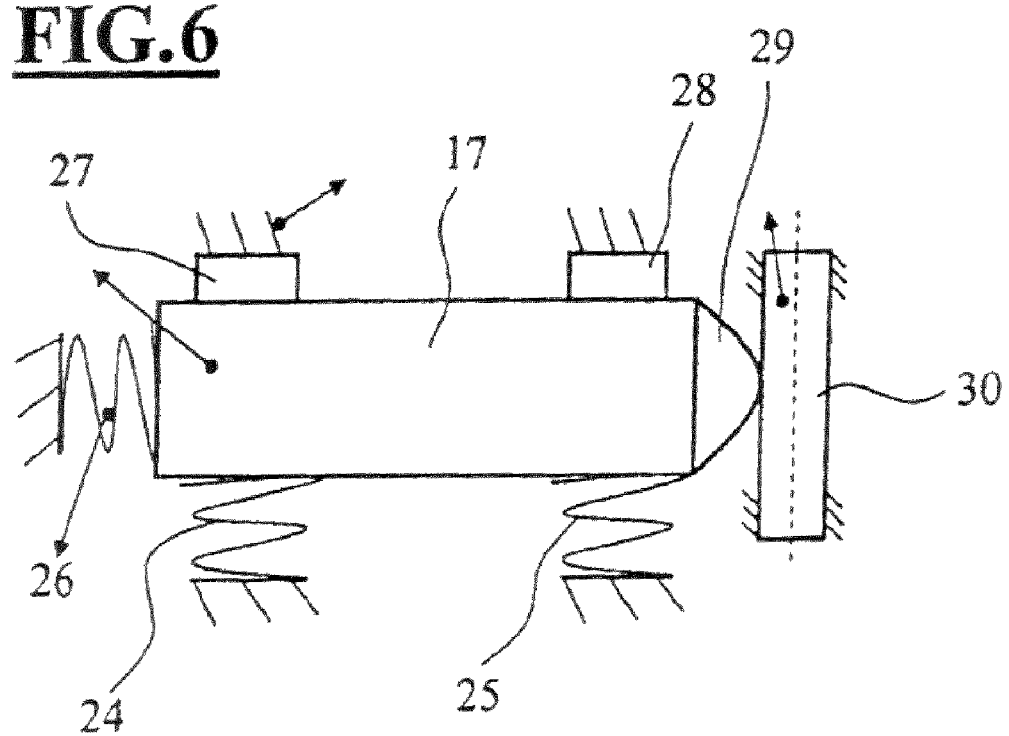

In an embodiment according to FIG. 6 for the holding arrangement of a protrusion 17 inside of a clamping element 1 (or constraining device 1) of the type that can be used to support the optical element 18 according to FIG. 2, elastically resilient elements 24, 25, 26 are set against the underside and a vertically oriented side of the protrusion 17, which are configured for example as pre-tensioned spiral or diaphragm springs. Rigid elements 27, 28 are arranged at the topside which is opposite the underside. On the opposite vertical side, the protrusion 17 has a domed end surface 29 which faces and rests against a cylindrical pin 30. Thus, the protrusion 17 is supported by force-based contact in regard to certain mechanical forces or loads. This force-based support is effective in the case where the mechanical load of the optical element consists for example of a downward-directed force pulse occurring for example as a result of a jolt or shock of the kind that can happen for example during transport and assembly of a unit that includes the optical element, for example an optical component of a lithography system. A force pulse or force impulse in the terminology of physics is normally defined as the time integral of a force. A force pulse can generally be caused by the change of a momentum or, in other words, by a momentary acceleration, or simply due to a force occurring over a short time. A downward-directed acceleration of the optical element occurring as a result of the force pulse is absorbed by the spring elements 24 and 25, or is even prevented if the spring elements have a sufficient amount of pre-tension. If the springs 24 and 25 are to be pre-tensioned, the amount of pre-tension is selected so that it approximately matches the maximum amounts of force that occur under the anticipated force pulses. This prevents that the protrusion 17 becomes separated or lifted off from the contact surfaces of the rigid elements 27 and 28. If the amount of pre-tension is chosen smaller, the protrusion 17 of the optical element can under the anticipated maximal force pulses lift off momentarily from the rigid elements 27 and 28, but will be brought back into contact with the latter via the springs 24 and 25 as the force subsides. Accordingly, the optical element will after a downward-directed force pulse (for example due to a jolt or shock) return to the desired position which is defined by the rigid elements 27 and 28.

For force pulsed in the tangential direction, whose force components are oriented in the direction from the cylindrical pin 30 towards the spring 26, the spring 26 and the cylindrical pin 30 perform an analogous function as the springs 24 and 25 and the rigid elements 27 and 28. The spring 26 can likewise be pre-tensioned, optionally with the amount of pre-tension being selected so that it approximately matches the maximum amount of force that occurs under the anticipated force pulses. This prevents that the protrusion is separated or lifted off from the contact surface at the cylindrical pin 30. Analogous to the springs 24 and 25, the amount of pre-tension of the spring 26 can be selected smaller than the expected maximum force from a force pulse, in which case the protrusion 17 can momentarily lift off from the contact surface of the cylindrical pin 30. Subsequently, as the force subsides, the protrusion is brought back into contact with the cylindrical pin 30 via the spring 26. Thus, after a force pulse with a tangential force component (for example due to a jolt or shock) the optical element returns to the desired position which is defined by the cylindrical pin 30. The springs shown in FIG. 6 can in general be replaced by an elastic device. It should be mentioned for the sake of completeness that a holder arrangement of an optical element via the embodiment of a constraining device is also held by frictional contact in case of force pulses with force components oriented in the direction of the rigid element 27, 28 and/or in the direction of the cylindrical pin 30. However, with a suitable choice of the dimensions of the holder arrangement, the holding force due to frictional contact is smaller than the holding force due to force contact. On the other hand, if the force pulse is oriented exactly in the direction of the rigid elements 27, 28 or exactly in the direction of the cylindrical pin 30, the optical element is held by form-fitting contact in the constraining device according to FIG. 6 via the protrusion 17.

Figure 7:
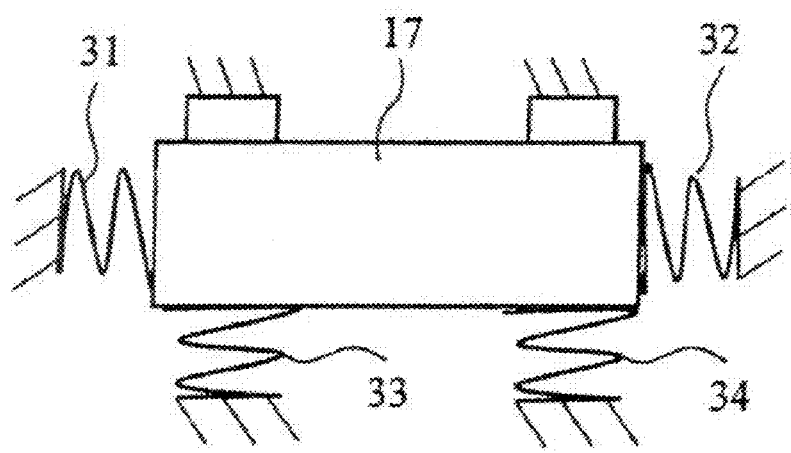

In another embodiment which is illustrated in FIG. 7, there are elastically resilient spring elements arranged at the underside as well as at the two vertical sides of the protrusion 17, in order to hold the optical element 21. This kind of an embodiment of the constraining device, in which the resilient elements can generally be elastic elements which can also be under a pre-tension, is selected in cases where the force pulses are anticipated to occur in random but downward-oriented direction and if the optical element is to be held through force-based contact. If force pulses are expected in random directions including upward, the remaining rigid elements of the arrangement in FIG. 7 which act on the topside of the protrusion 17 can also be replaced by resilient or elastic elements which may also be pre-tensioned.

Figure 8:
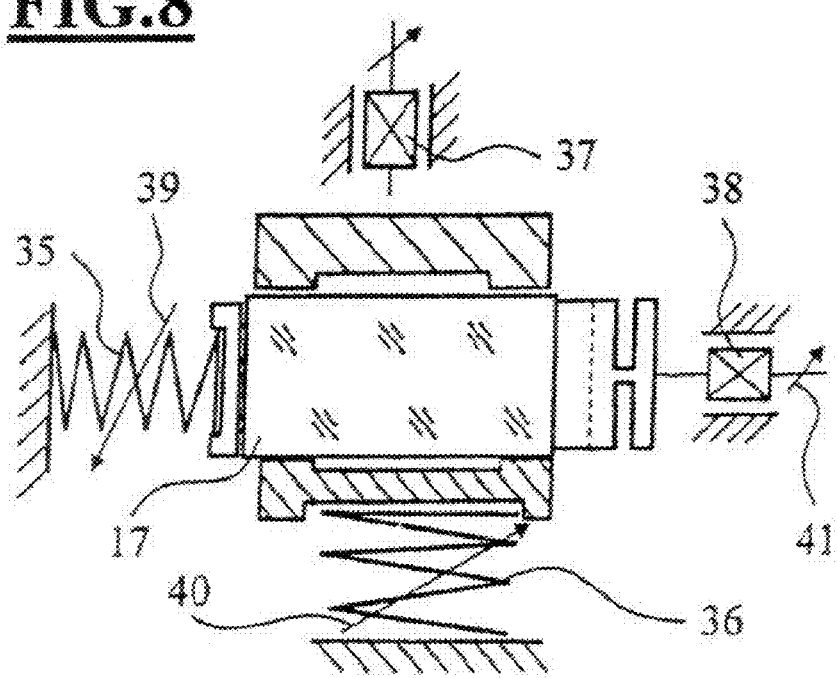

In a further embodiment which is illustrated in FIG. 8, the protrusion 17 is held on two sides by elastic elements 35, 36 and at the two other sides by rigid elements 37, 38. For each direction there is at least one adjustment device 39, 40, 41 provided which serves to change the distance of the rigid element 37, 38 or the length of the resilient elements 35, 36 so that as an overall result, the spring force (under which the elements 35, 36 are compressed against the protrusion 17), i.e. that the pre-tension of the resilient or elastic elements and the position of the optical element can be adjusted and changed, and that the position of the protrusion 17 can likewise be adjusted. Thus, the position of the protrusion 17 can be adjusted with at least one degree of freedom independent of a pre-tension that may be present in the elastic element 35, 36. The rigid elements 37 and 38 can also generally be replaced by elastic elements, wherein however at least one—or both—of the elastic elements are provided likewise with an adjustment device 41 in order to allow a change of position. Accordingly, the protrusion 17 can be adjusted in regard to its position with at least one—respectively with two—degrees of freedom, with the additional possibility of setting a pre-tension of the elastic elements independently of the position of the protrusion 17, so that the elastic elements bear against the optical element or its protrusion with a desired amount of pre-tension. If the optical element is held for example via three protrusions 17 or constraint locations 17, with each constraint location being adjustable in its position with two degrees of freedom, the optical element is adjustable with a total of up to six degrees of freedom, with the possibility to set a pre-tension under which the elements 35, 36 push against the protrusion 17 in at least one—or in all—of the constraint locations independently of the position of the respective constraint location 17 and thus independently of the position of the optical element.

Figure 9:
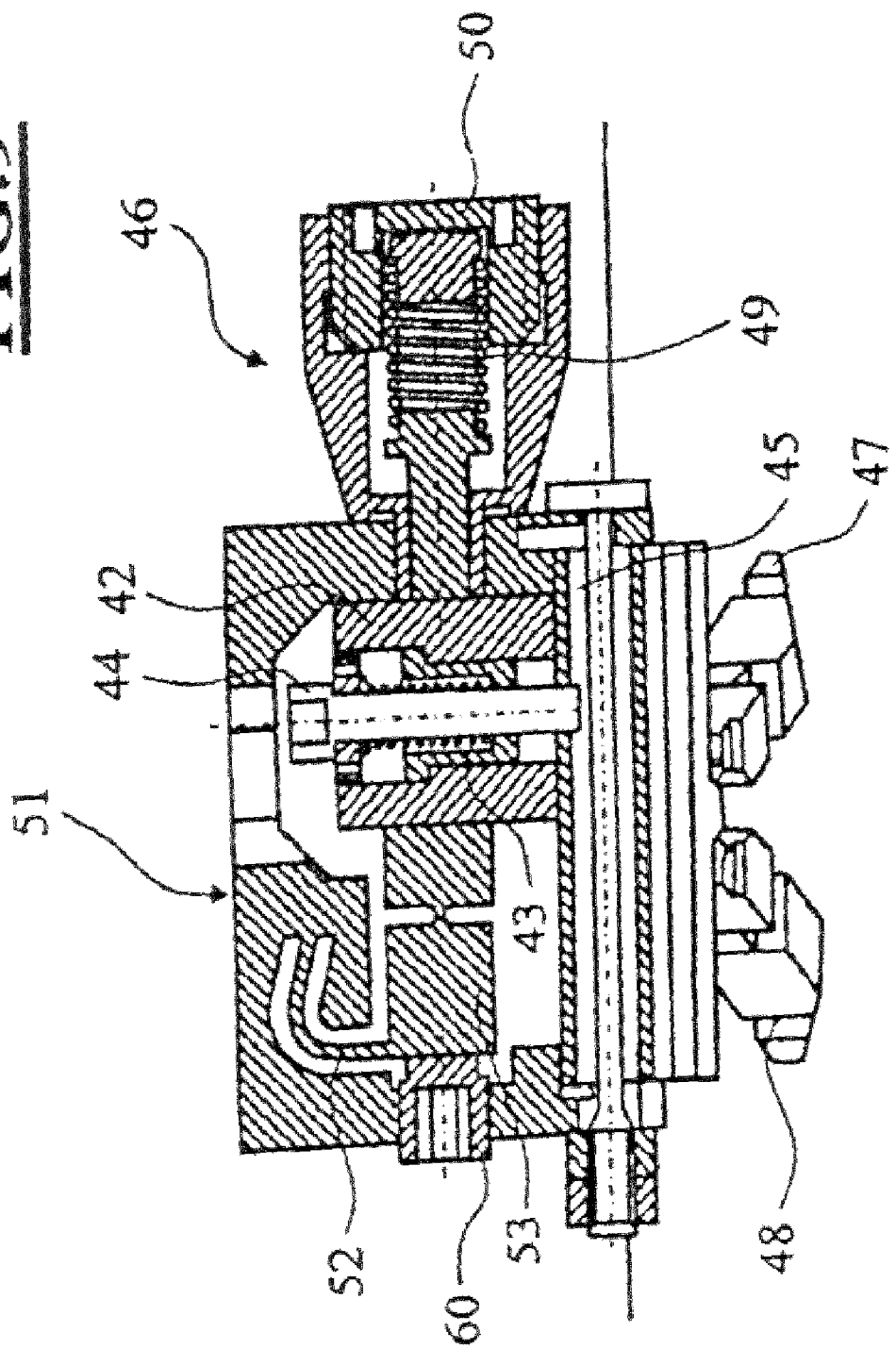
FIG. 9 illustrates a fastening arrangement whereby an optical element is held via a clamp.

In a further embodiment of the disclosure which is illustrated in FIG. 9, the optical element has a protrusion 42 that is connected by way of a screw 44 which is surrounded by a compression spring 43 to a head element 45 of an isostatic (statically determinate) bearing element 46. The bearing element, in turn, is supported and fastened relative to a carrier element by way of a bipod formed of two feet 47, 48. The protrusion 42 is elastically supported in the tangential direction by way of a screw 50 that is surrounded by a compression spring 49. The bearing element 46 includes at its topside a bracket 51 which includes a leaf spring 52. The leaf spring 52 facilitates the insertion of the protrusion 42 into the space between the head element 45 and the bracket 51. A connecting piece 53 joined to the leaf spring 52 includes a monolithically incorporated hinge 54, so that an elastic constraint of the protrusion 42 in the tangential direction is assisted by the screw 50. The connecting piece 53 can be adjusted in the tangential direction via an adjusting element 60, whereby the position of the protrusion 42 can be adjusted in this direction. By adjusting the screw 50, the protrusion 52 can again be held with a desired amount of pre-tension or without pre-tension. This provides one degree of freedom to adjust the optical element in regard to its position and—independent of the position of the optical element with the protrusion 42—to set a desired amount of pre-tension which bears against the protrusion 42. The constraint location 17, 42 of an optical element 18, 21 can thereby generally be adjusted with at least one degree of freedom in regard to the position of the constraint location, while the optical element 18, 21 is in addition held by way of the constraint location 17, 42 in at least one direction by way of at least one elastic element or at least one elastic spring element 14, 15, 16, 49 through force-based contact, wherein a pre-tension which could be added to the holding force produced by the elastic spring element or the elastic element is adjustable independent of the position of the constraint location and thus independent of the position of the optical element. In a further embodiment, the adjusting element 60 is replaced for example by a device that is equivalent to the screw 50, or by the same kind of screw, wherein the screw is also optionally surrounded by a compression spring 49.

Other embodiments are in the claims.

What is claimed is:

1. An arrangement, comprising:
    an optical element having an outer peripheral area and at least three constraint locations arranged at the outer peripheral area of the optical element;
    a constraining device for each of the constraint locations, at least one of the constraining devices having a carrier body;
    elastically resilient elements arranged in the carrier body of the at least one of the constraining devices; and
    a support supporting each of the constraining devices,
    wherein, in at least one of the constraint locations, the optical element is constrained in two opposite directions through force-based contact with the elastically resilient elements.

2. The arrangement according to claim 1, wherein the constraining devices constrain the optical element in a statically determinate manner on the support.

3. The arrangement according to claim 1, wherein the elastically resilient elements constrain the optical element through force-based contact in first and second tangential directions relative to the optical element, and the first tangential direction is opposite to the second tangential direction.

4. The arrangement according to claim 3, wherein the elastically resilient elements constrain the optical element through force-based contact in an axial direction that is parallel to an optical axis of the optical element.

5. An assembly, comprising:
    a plurality of constraining devices attachable to a support, at least one of the constraining devices having a carrier body; and
    elastically resilient elements arranged in the carrier body of the at least one of the constraining devices,
    wherein the assembly is configured so that an optical element having constraining locations at its outer periphery can be constrained via at least one of the constraint locations in at least three directions through force-based contact with the elastically resilient elements.

6. The assembly according to claim 5, wherein the plurality of constraining devices can constrain the optical element in a statically determinate manner in the carrier body.

7. The assembly according to claim 5, wherein the assembly is configured so that the optical element can be constrained through force-based contact via at least one of the constraint locations in first and second tangential directions relative to the optical element and in an axial direction that is parallel to an optical axis of the optical element, and the first tangential direction is opposite to the second tangential direction.

8. The assembly according to claim 5, wherein the constraint locations are held exclusively via force-based contact.

9. The assembly according to claim 5, wherein the optical element is constrained in an axial direction that is parallel to an optical axis of the optical element through force-based contact.

10. The assembly according to claim 5, wherein the constraint locations are protrusions extending radially from the optical element.

11. The assembly according to claim 5, wherein the constraint locations are integral with the optical element.

12. The assembly according to claim 5, wherein, at each constraint location, two coupling locations are provided on which two holding forces can act to hold the optical element in the carrier body.

13. The assembly according to claim 12, wherein, through each coupling location, an axial force and a tangential force can act on the optical element.

14. The assembly according to claim 5, wherein, at each coupling location, an axial force and a force with an arbitrary direction perpendicular to an optical axis of the optical element can act on the optical element.

15. The assembly according to claim 5, wherein the constraint locations are held exclusively via force-based contact.

16. The assembly according to claim 5, wherein the elastic elements are at least partially surrounded by the carrier body.

17. The assembly according to claim 16, wherein the elastic elements comprise pre-tensioned compression springs.

18. The assembly according to claim 17, wherein the compression springs constrain the protrusions in axial and tangential directions relative to the optical element.

19. The assembly according to claim 17, wherein at least two compression springs are arranged in the tangential direction, and at least one compression spring is arranged in the axial direction.

20. The assembly according to claim 17, wherein the compression springs are pre-tensioned only to an extent that is sufficient to enable the compression springs to absorb shock loads that occur in transporting the optical element.

21. The assembly according to claim 17, wherein the compression springs are received in recesses formed in the optical element.

22. A device, comprising:
    at least two assemblies according to claim 5, wherein the optical elements of the assemblies are arranged on a single carrier.

* * * * *

UNITED STATES PATENT AND TRADEMARK OFFICE
CERTIFICATE OF CORRECTION

| | | |
|---|---|---|
| PATENT NO. | : 7,920,344 B2 | Page 1 of 1 |
| APPLICATION NO. | : 12/506450 | |
| DATED | : April 5, 2011 | |
| INVENTOR(S) | : Armin Schoeppach et al. | |

It is certified that error appears in the above-identified patent and that said Letters Patent is hereby corrected as shown below:

<u>Column 3,</u>
Line 27, delete "Of" and insert --of--

<u>Column 5,</u>
Line 66, delete "and" and insert --15 and--

Signed and Sealed this
Seventeenth Day of May, 2011

David J. Kappos
*Director of the United States Patent and Trademark Office*

UNITED STATES PATENT AND TRADEMARK OFFICE
CERTIFICATE OF CORRECTION

PATENT NO. : 7,920,344 B2  
APPLICATION NO. : 12/506450  
DATED : April 5, 2011  
INVENTOR(S) : Armin Schoeppach et al.

Page 1 of 1

It is certified that error appears in the above-identified patent and that said Letters Patent is hereby corrected as shown below:

On the Title Page Item (75), Inventors: Delete "Zenger/Ling," and insert --Zengerling,--

Signed and Sealed this  
Ninth Day of August, 2011

David J. Kappos  
*Director of the United States Patent and Trademark Office*